(12) United States Patent
Wilson et al.

(10) Patent No.: US 11,611,132 B2
(45) Date of Patent: Mar. 21, 2023

(54) BATTERY CAP WITH CUT-OUT SECTIONS

(71) Applicant: Apple Inc., Cupertino, CA (US)

(72) Inventors: Jonathan C. Wilson, San Jose, CA (US); Charles H. Laird, Los Gatos, CA (US)

(73) Assignee: Apple Inc., Cupertino, CA (US)

( * ) Notice: Subject to any disclaimer, the term of this patent is extended or adjusted under 35 U.S.C. 154(b) by 193 days.

(21) Appl. No.: 16/840,154

(22) Filed: Apr. 3, 2020

(65) Prior Publication Data

US 2020/0235365 A1    Jul. 23, 2020

Related U.S. Application Data

(63) Continuation of application No. 15/709,395, filed on Sep. 19, 2017, now Pat. No. 10,615,395.

(60) Provisional application No. 62/504,467, filed on May 10, 2017.

(51) Int. Cl.
*H01M 10/42* (2006.01)
*H01M 50/502* (2021.01)
*H01M 50/147* (2021.01)

(52) U.S. Cl.
CPC ..... *H01M 50/502* (2021.01); *H01M 10/4257* (2013.01); *H01M 50/147* (2021.01); *H01M 2010/4271* (2013.01); *H01M 2220/30* (2013.01)

(58) Field of Classification Search
CPC .................................................. H01M 50/502
See application file for complete search history.

(56) References Cited

U.S. PATENT DOCUMENTS

| | | |
|---|---|---|
| 8,057,554 B2 | 11/2011 | Xu et al. |
| 8,343,653 B2 | 1/2013 | Baek |
| 8,377,584 B2 | 2/2013 | Suzuki |
| 8,426,057 B2 | 4/2013 | Park et al. |
| 8,691,429 B2 | 4/2014 | Kim et al. |
| 8,709,645 B2 | 4/2014 | Roy |
| 8,900,741 B2 | 12/2014 | Kim |
| 9,660,302 B2 | 5/2017 | Kim et al. |
| 9,799,912 B2 | 10/2017 | Lee et al. |
| 10,615,395 B2 | 4/2020 | Wilson et al. |

(Continued)

FOREIGN PATENT DOCUMENTS

| | | |
|---|---|---|
| EP | 1760803 A | 3/2007 |
| EP | 2333870 | 6/2011 |

(Continued)

OTHER PUBLICATIONS

Office action from Chinese Application No. 201880030812.7, dated Sep. 27, 2021, (English translation and Chinese Version), pp. 1-16.

(Continued)

*Primary Examiner* — Brian R Ohara
(74) *Attorney, Agent, or Firm* — Robert C. Kowert; Kowert, Hood, Munyon, Rankin & Goetzel, P.C.

(57) ABSTRACT

Various embodiments described herein relate to a battery that includes a battery cap with one or more cut-out sections. The battery cap may be used to at least partially cover a circuit board that is proximate an end of a battery cell. In various examples, the cut-out sections may be configured to accommodate one or more cell tabs of the battery that protrude above the circuit board.

20 Claims, 9 Drawing Sheets

(56) References Cited

U.S. PATENT DOCUMENTS

| | | | |
|---|---|---|---|
| 2002/0180405 A1* | 12/2002 | Batson | H01M 10/48 320/128 |
| 2005/0069764 A1* | 3/2005 | Kodama | H01M 10/02 429/185 |
| 2009/0004561 A1* | 1/2009 | Nansaka | H01M 4/661 429/185 |
| 2009/0085518 A1 | 4/2009 | Hong et al. | |
| 2009/0130554 A1 | 5/2009 | Jang et al. | |
| 2009/0304949 A1 | 5/2009 | Jang | |
| 2010/0075205 A1 | 3/2010 | Kwag et al. | |
| 2010/0092859 A1 | 4/2010 | Kim et al. | |
| 2010/0151281 A1 | 6/2010 | Kwag et al. | |
| 2011/0129725 A1 | 6/2011 | Baek | |
| 2011/0171498 A1 | 7/2011 | Baek | |
| 2011/0244276 A1 | 10/2011 | Takeshita et al. | |
| 2012/0070698 A1 | 3/2012 | Baek | |
| 2012/0129017 A1 | 5/2012 | Ota | |
| 2013/0149563 A1* | 6/2013 | Lee | H01M 50/148 429/7 |
| 2014/0178715 A1 | 6/2014 | Koh | |
| 2014/0196839 A1 | 7/2014 | Roy | |
| 2015/0004441 A1 | 1/2015 | Jeong et al. | |
| 2016/0072154 A1* | 3/2016 | Kim | H01M 50/209 429/179 |
| 2016/0218330 A1 | 7/2016 | Seong | |
| 2016/0260997 A1 | 9/2016 | Lee et al. | |
| 2016/0268650 A1 | 9/2016 | Heo | |

FOREIGN PATENT DOCUMENTS

| | | |
|---|---|---|
| EP | 3001483 | 3/2016 |
| JP | 2006202629 | 8/2006 |
| JP | 2016162755 A | 9/2016 |
| KR | 20110105737 A | 9/2011 |

OTHER PUBLICATIONS

Notice of Allowance from Chinese Application No. 20188030812.7, dated Apr. 8, 2022, pp. 1-4.

International Search Report and Written Opinion from PCT/US2018/031868, dated Jul. 6, 2018, Apple Inc., pp. 1-11.

\* cited by examiner

BATTERY CAP WITH CUT-OUT SECTIONS

BACKGROUND

This application is a continuation of U.S. patent application Ser. No. 15/709,395, filed Sep. 19, 2017, which claims benefit of priority to U.S. Provisional Application No. 62/504,467, filed May 10, 2017, which are hereby incorporated by reference in their entirety.

Technical Field

This disclosure relates generally to batteries, and more specifically to small form factor, or compact, batteries that include a battery cap with one or more cut-out sections.

Description of the Related Art

The advent of small, mobile multipurpose devices such as smartphones and tablet or pad devices has resulted in a need for small form factor batteries for integration in the devices. Some batteries may incorporate a casing around one or more other components. For instance, the casing may be used to protect those other components. The casing may add an extra layer of thickness to the thickness of the battery that already exists due to the other components. In some cases, the extra layer of thickness may be a limiting factor in reducing the overall form factor of the battery.

SUMMARY OF EMBODIMENTS

Various embodiments include a battery. The battery may be configured to supply electric power (e.g., to an electronic device). The battery may include a battery cell having an anode tab and a cathode tab. In some examples, the battery may include a circuit board having a battery monitoring integrated circuit disposed thereon. The circuit board may be electrically coupled to the anode tab and the cathode tab. Furthermore, the battery may include a battery cap over at least a portion of the circuit board. In some cases, the circuit board may be located proximate an end of the battery cell, e.g., the end from which the anode tab and the cathode tab extend.

According to some embodiments, the battery cap may include a wall having an inner surface and an opposing outer surface. The wall may define one or more cut-out sections that collectively accommodate the anode tab and the cathode tab. For instance, each of the anode tab and the cathode tab may extend between the circuit board and the outer surface of the wall in a direction that is orthogonal to the outer surface. Furthermore, a respective upper surface of each of the anode tab and the cathode tab may be disposed within a respective cut-out section, between the inner surface of the wall and the outer surface of the wall.

In some embodiments, the battery may include one or more cover strips covering one or more surfaces of the battery cap, the anode tab, and/or the cathode tab.

Some embodiments include a device (e.g., an electronic device). The device may include a battery, a display, and/or one or more processors. The battery may include a battery cell, a circuit board, and a battery cap. The battery cell may have an anode tab and a cathode tab. The circuit board may have a battery monitoring circuit disposed thereon. In some examples, the circuit board may be electrically coupled to the anode tab and the cathode tab. According to various embodiments, the circuit board may be located proximate an end of the battery cell, e.g., the end from which the anode tab and the cathode tab extend.

In various examples, the battery cap may be over at least a portion of the circuit board. The battery cap may include a top wall that has a bottom surface and an opposing top surface. The top wall may define cut-out sections that collectively accommodate the anode tab and the cathode tab.

Some embodiments include a method of constructing a battery. In some embodiments, the method may include electrically coupling a circuit board to an anode tab and a cathode tab of a battery cell. The circuit board may have a battery monitoring integrated circuit disposed thereon. The method may also include enclosing at least a portion of the circuit board with a battery cap. The battery cap may include a wall that defines one or more cut-out sections that collectively accommodate the anode tab and the cathode tab.

In some examples, the method may include covering one or more surfaces of the battery cap, the anode tab, and/or the cathode tab with one or more cover strips.

BRIEF DESCRIPTION OF THE DRAWINGS

In FIGS. 3A-3B, the battery may include one or more cover strips.

In FIG. 4, the battery may include one or more cover strips and/or a cosmetic label.

Figure 1:
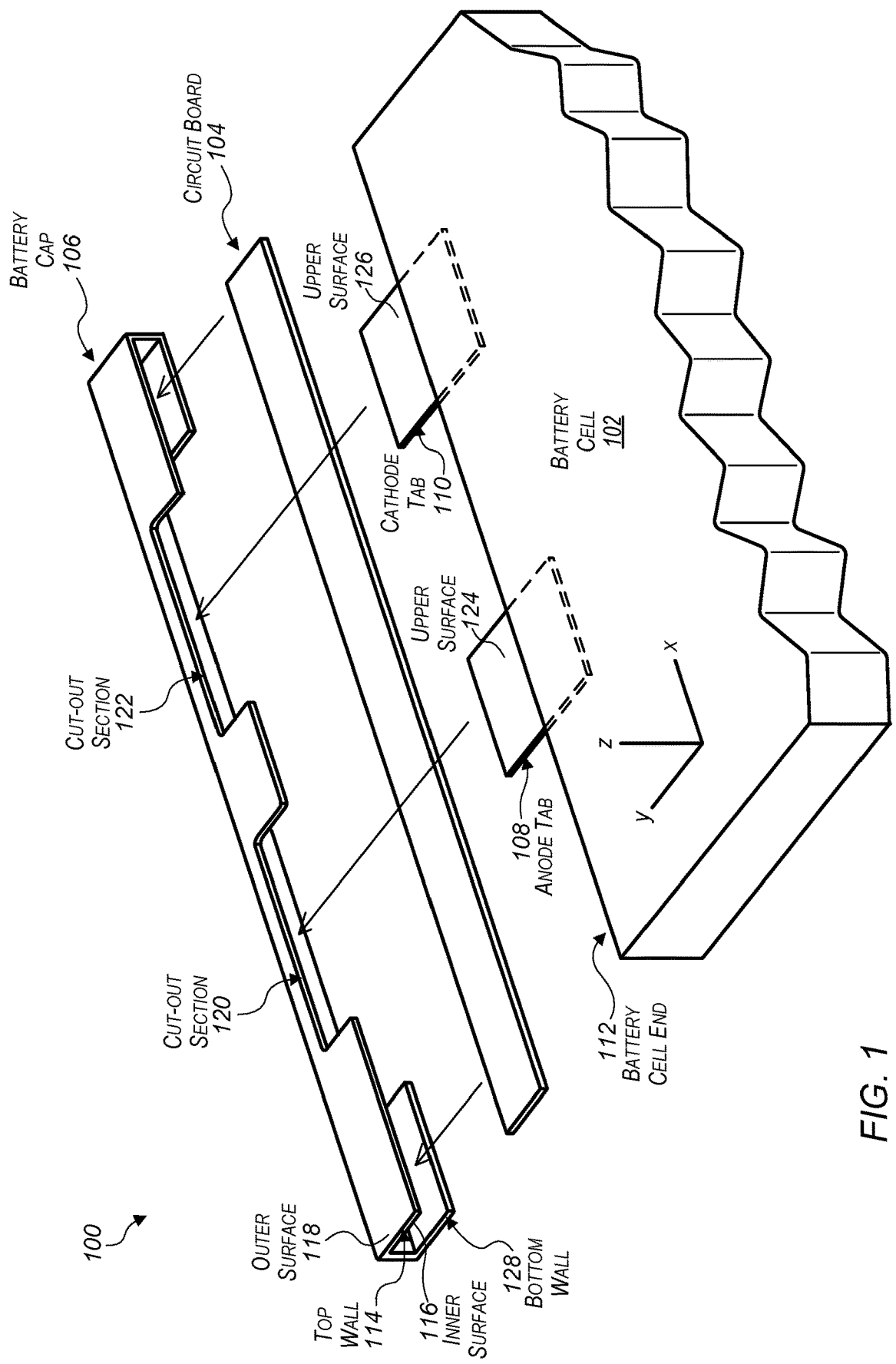
FIG. 1 illustrates a perspective view of an example battery that includes a battery cap with one or more cut-out sections, in accordance with some embodiments.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

"Comprising." This term is open-ended. As used in the appended claims, this term does not foreclose additional structure or steps. Consider a claim that recites: "An apparatus comprising one or more processor units . . . ." Such a claim does not foreclose the apparatus from including additional components (e.g., a network interface unit, graphics circuitry, etc.).

"Configured To." Various units, circuits, or other components may be described or claimed as "configured to" perform a task or tasks. In such contexts, "configured to" is used to connote structure by indicating that the units/circuits/components include structure (e.g., circuitry) that performs those task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. § 112, sixth paragraph, for that unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue. "Configure to" may also include adapting a manufacturing process (e.g., a semiconductor fabrication facility) to fabricate devices (e.g., integrated circuits) that are adapted to implement or perform one or more tasks.

"First," "Second," etc. As used herein, these terms are used as labels for nouns that they precede, and do not imply any type of ordering (e.g., spatial, temporal, logical, etc.). For example, a buffer circuit may be described herein as performing write operations for "first" and "second" values. The terms "first" and "second" do not necessarily imply that the first value must be written before the second value.

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While in this case, B is a factor that affects the determination of A, such a phrase does not foreclose the determination of A from also being based on C. In other instances, A may be determined based solely on B.

DETAILED DESCRIPTION

Various embodiments described herein relate to a battery that includes a battery cap with one or more cut-out sections. The battery cap may be used to at least partially enclose a circuit board (e.g., a circuit board having a battery monitoring integrated circuit disposed thereon) that is proximate an end of a battery cell. The cut-out sections may be configured to accommodate an anode tab and a cathode tab that extend from the end of the battery cell. Such accommodation of the anode tab and the cathode tab by the cut-out sections allows for a reduction in a dimension (e.g., a z dimension) of the battery as compared to using a battery cap that does not include the cut-out sections. In some cases, the z dimension of the battery may be reduced by about a wall thickness of the battery cap.

In some embodiments, a battery may include a battery cell, a circuit board, and a battery cap. The battery cell may have an anode tab and a cathode tab. The circuit board may have a battery monitoring integrated circuit disposed thereon. In various examples, the circuit board may be electrically coupled to the anode tab and the cathode tab. In some cases, the circuit board may be located proximate an end of the battery cell, e.g., the end from which the anode tab and the cathode tab extend. The battery monitoring integrated circuit disposed on the circuit board may be configured to monitor one or more properties of the battery. For instance, the battery monitoring integrated circuit may be configured to monitor an amount of power remaining in the battery cell and/or an amount of current being drawn from the battery cell.

According to various embodiments, the battery cap may include a wall having an inner surface and an outer surface that is opposite the inner surface. The wall may define one or more cut-out sections that collectively accommodate the anode tab and the cathode tab. For instance, each of the anode tab and the cathode tab may extend between the circuit board and the outer surface of the wall in a direction that is orthogonal to the outer surface. Furthermore, a respective upper surface of each of the anode tab and the cathode tab may be disposed within a respective cut-out section, between the inner surface of the wall and the outer surface of the wall.

In some embodiments, each of the anode tab and the cathode tab may extend, in the direction that is orthogonal to the outer surface of the wall, from a respective first plane to a respective second plane. For example, the respective first plane may be parallel to the outer surface and may be located between the circuit board and the outer surface. The respective second plane may be parallel to the inner surface of the wall and may be located between the inner surface and the outer surface. In some examples, each of the anode tab and the cathode tab may include a respective upper surface at the respective second plane. A respective distance, in the direction that is orthogonal to the outer surface of the wall, from the respective upper surface (of each of the anode tab and the cathode tab) to the outer surface of the wall may be less than a threshold distance.

In some embodiments, the upper surface of the anode tab and/or the upper surface of the cathode tab may be recessed within the respective cut-out section that accommodates the anode tab and/or the cathode tab. In some examples, the upper surface of the anode tab and/or the upper surface of the cathode tab may be coplanar with the outer surface of the wall.

In some embodiments, the battery may include one or more cover strips configured to cover one or more surfaces of the battery cap, the anode tab, and/or the cathode tab. As an example, a first cover strip may cover the upper surface of the anode tab, and a different second cover strip may cover the upper surface of the cathode tab. In some cases, a cover strip may cover the upper surface of the anode tab, the upper surface of the cathode tab, and at least a portion of the battery cap. For instance, the cover strip may be 0.1 mm or thinner in some examples.

In some embodiments, the battery may include a first cover strip, a second cover strip, and a third cover strip. The first cover strip may cover the upper surface of the anode tab. The second cover strip may cover the upper surface of the cathode tab. The third cover strip may cover the first cover strip, the second cover strip, and at least a portion of the outer surface of the wall. The third cover strip may be flat in some instances. In some embodiments, the battery may include a cosmetic label that covers the third cover strip. The cosmetic label may provide a cosmetic finish by forming a layer adjacent to the third cover strip that is flat. For instance, a portion of the cosmetic label that covers the third cover strip may be flat and/or smooth based at least in part on the corresponding flatness and/or smoothness of the third cover strip.

Some embodiments include a device (e.g., an electronic device). The device may include a battery, a display, and/or one or more processors. The battery may comprise a battery cell, a circuit board, and a battery cap. The battery cell may have an anode tab and a cathode tab. The circuit board may have a battery monitoring integrated circuit disposed thereon. In various examples, the circuit board may be electrically coupled to the anode tab and the cathode tab.

According to various embodiments, the battery cap may be over at least a portion of the circuit board. The battery cap may have a top wall that comprises a bottom surface and an opposing top surface. The top wall may define one or more cut-out sections that collectively accommodate the anode tab and the cathode tab. For instance, each of the anode tab and the cathode tab may extend between the circuit board and the top surface of the top wall in a direction that is orthogonal to the top surface. Furthermore, the anode tab and the cathode tab may be accommodated by the cut-out sections such that a respective upper surface of each of the anode tab and the cathode tab is disposed within a respective cut-out section, between the bottom surface of the top wall and the top surface of the top wall.

In some embodiments, each of the anode tab and the cathode tab may extend, in the direction that is orthogonal to the top surface of the top wall, from a respective first plane to a respective second plane. For instance, the respective first plane may be parallel to the top surface of the top wall and may be located between the circuit board and the top surface. The respective second plane may be parallel to the top surface and may be located between the bottom surface and the top surface. In some cases, a respective distance, in the direction that is orthogonal to the top surface, from the respective upper surface of each of the anode tab and the cathode tab to the top surface of the top wall may be less than a threshold distance.

In some examples, the display may be configured to present visual content at a plane that is parallel to the top surface of the top wall. The processors may be configured manage electric power provided from the battery to various components of the device. As a non-limiting example, the processors may receive signals associated with the battery from the circuit board. The processors may manage electric power provided from the battery to another component of the device (e.g., the display) based at least in part on the signals received from the circuit board.

According to some embodiments, the device may include a signal channel configured to convey signals and/or electric power between the circuit board and another component of the device (e.g., a logic board that includes the processors). A portion of the signal channel may be in electrical contact with the circuit board. Furthermore, the battery cap may be configured to at least partially encompass the portion of the signal channel that is in electrical contact with the circuit board.

In various embodiments, the device may include one or more cover strips configured to cover one or more surfaces of the battery cap, the anode tab, and/or the cathode tab. As a non-limiting example, the device may include a first set of cover strips and/or a second set of one or more cover strips. The first set of cover strips may include, for the respective upper surface of each of the anode tab and the cathode tab, a respective upper surface cover strip. The respective upper surface cover strip may be adhered to the respective upper surface of each of the anode tab and the cathode tab such that the respective upper surface cover strip covers the respective upper surface.

The second set of one or more cover strips may include a cap wall cover strip adhered to the top surface of the top wall of the battery cap. The cap wall cover strip may be adhered to the top surface such that the cap wall cover strip covers the top surface. Furthermore, the cap wall cover strip may be adhered such that it covers the respective upper surface cover strips and/or the respective upper surface of each of the anode tab and the cathode tab.

In some cases, the device may include a cosmetic label that covers the second set of one or more cover strips such that the cosmetic label provides a cosmetic finish by forming a layer adjacent to the second set of one or more cover strips that is substantially planar. For instance, a portion of the cosmetic label that covers the cap wall cover strip may be flat and/or smooth based at least in part on the corresponding flatness and/or smoothness of the cap wall cover strip.

Some embodiments include a method of constructing a battery. In some embodiments, the method may include electrically coupling a circuit board to an anode tab and a cathode tab of a battery cell. In some examples, the circuit board may have a battery monitoring integrated circuit disposed thereon.

Furthermore, the method may include enclosing at least a portion of the circuit board with a battery cap. The battery cap may have a wall that defines one or more cut-out sections. For instance, the cut-out sections may collectively accommodate the anode tab and the cathode tab of the battery cell. Enclosing the portion of the battery circuit board with the battery cap may include positioning the anode tab and the cathode tab within the cut-out sections. Each of the anode tab and the cathode tab may extend between the circuit board and an outer surface of the wall in a direction that is orthogonal to the outer surface. Furthermore, a respective upper surface of each of the anode tab and the cathode tab is disposed within a respective cut-out section, between an inner surface of the wall and the outer surface of the wall that is opposite the inner surface.

In some examples, the method may include covering one or more surfaces of the battery cap, the anode tab, and/or the cathode tab with one or more cover strips. For instance, a first cover strip may be used to cover the upper surface of the anode tab. A second cover strip may be used to cover the upper surface of the cathode tab. Additionally, or alternatively, a third cover strip may be used to cover at least a portion of the outer surface of the wall of the battery cap, the first cover strip, and/or the second cover strip. In some implementations, the method may further include covering at least a portion of the third cover strip with a cosmetic label such that the cosmetic label provides a cosmetic finish by forming a layer adjacent to the third cover strip that is substantially planar.

In some instances, the method may include forming the battery cap. In some cases, the battery cap may be formed of a nonconductive material (e.g., a plastic) via a molding process (e.g., injection molding). The battery cap may be formed such that the battery cap includes one or more cut-out sections that accommodate the anode tab and the cathode tab of the battery. In some cases (e.g., where cover strips are not used), the battery cap may be formed such that it includes metal inserts. As a non-limiting example, a plastic material may be molded to form the battery cap. During the molding, metal inserts may be embedded in the plastic material. The metal inserts may be configured to encompass at least one top portion of the one or more cut-out sections.

In some examples, a respective outer surface of a respective one of the metal inserts may be coplanar with the outer surface of the wall of the battery cap. Furthermore, a respective inner surface of the respective one of the metal inserts may be opposite the respective outer surface and may be configured to face a respective one of the anode tab and the cathode tab.

Reference will now be made in detail to embodiments, examples of which are illustrated in the accompanying drawings. In the following detailed description, numerous specific details are set forth in order to provide a thorough understanding of the present disclosure. However, it will be apparent to one of ordinary skill in the art that some embodiments may be practiced without these specific details. In other instances, well-known methods, procedures, components, circuits, and networks have not been described in detail so as not to unnecessarily obscure aspects of the embodiments.

The terminology used in the description herein is for the purpose of describing particular embodiments only and is not intended to be limiting. As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

FIG. 1 illustrates a perspective view of an example battery 100 that includes a battery cap with one or more cut-out sections, in accordance with some embodiments. In some embodiments, the battery 100 may include one or multiple features, components, and/or functionality of embodiments described herein with reference to FIGS. 2A-8.

In various embodiments, the battery 100 may include a battery cell 102 (e.g., a lithium-ion battery cell), a circuit board 104, and a battery cap 106. The battery cell 102 may have an anode tab 108 and a cathode tab 110. In some examples, the anode tab 108 and the cathode tab 110 may extend outwardly from an end 112 of the battery cell 102. Furthermore, in some embodiments, the anode tab 108 and the cathode tab 110 may be in electrical contact with the circuit board 104.

In some cases, the circuit board 104 may be located proximate to the end 112 of the battery cell 102. In some examples, the circuit board 104 may have a battery monitoring integrated circuit disposed thereon. The battery monitoring integrated circuit may be configured to monitor one or more properties of the battery 100. For instance, the battery monitoring integrated circuit may be configured to monitor an amount of power remaining in the battery cell 102 and/or an amount of current being drawn from the battery cell 102. It should be understood, however, that the circuit board 104 and/or the battery monitoring integrated circuit may additionally, or alternatively, monitor any other suitable properties associated with the battery 100.

In some embodiments, the battery cap 106 may include a top wall 114 having an inner surface 116 and an outer surface 118. The outer surface 118 may be opposite the inner surface 116. In some examples, the inner surface 116 and/or the outer surface 118 may be planar surfaces. The top wall 114 may define one or more cut-out sections (e.g., cut-out sections 120, 122). For instance, a first cut-out section 120 may be configured to accommodate the anode tab 108. A second cut-out section 122 may be configured to accommodate the cathode tab 110. Each of the anode tab 108 and the cathode tab 110 may extend in a direction that is orthogonal to the outer surface 118 of the top wall 114 (also referred to herein as the "protruding direction", which may extend, e.g., in the z-axis direction indicated in the coordinate system in FIG. 1).

In some cases, each of the anode tab 108 and the cathode tab 110 may extend, in the protruding direction, between the circuit board 104 and the outer surface 118 of the top wall 114. Furthermore, a respective upper surface 124, 126 of each of the anode tab 108 and the cathode tab 110 may be disposed within a respective cut-out section 120, 122. For instance, a first upper surface 124 of the anode tab 108 may be disposed within the first cut-out section 120, between the inner surface 116 of the top wall 114 and the outer surface 118 of the top wall 114. In some examples, a distance (in the protruding direction) between the first upper surface 124 of the anode tab 108 and the outer surface 118 of the top wall 114 may be less than a threshold distance. Furthermore, a second upper surface 126 of the cathode tab 110 may be disposed within the second cut-out section 122, between the inner surface 116 of the top wall 114 and the outer surface 118 of the top wall 114. In some examples, a distance (in the protruding direction) between the second upper surface 126 of the cathode tab 110 and the outer surface 118 of the top wall 114 may be less than the threshold distance. The threshold distance may be determined based at least in part on one or more design constraints of the battery 100. In various embodiments, the respective upper surface 124, 126 of each of the anode tab 108 and the cathode tab 110 may be substantially flush and/or coplanar with the outer surface 118 of the top wall 114.

According to some examples, the battery cap 106 may include a bottom wall 128 that is opposite the top wall 114. In various instances, the circuit board 104 may be disposed, in the protruding direction, between the bottom wall 128 and the top wall 114.

Figure 2A:
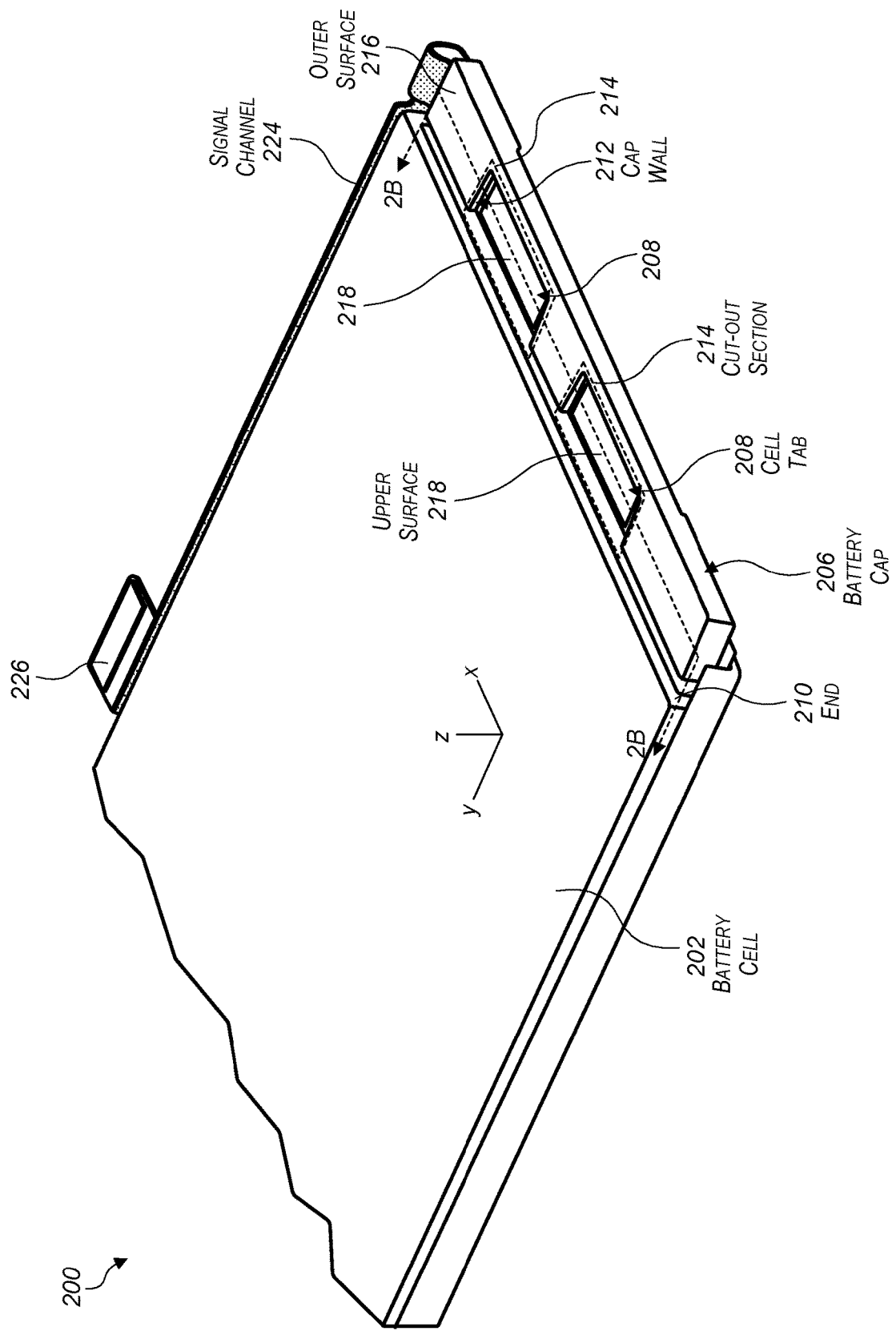
FIG. 2A illustrates a perspective view of another example battery that includes a battery cap with one or more cut-out sections, in accordance with some embodiments.
Figure 2B:
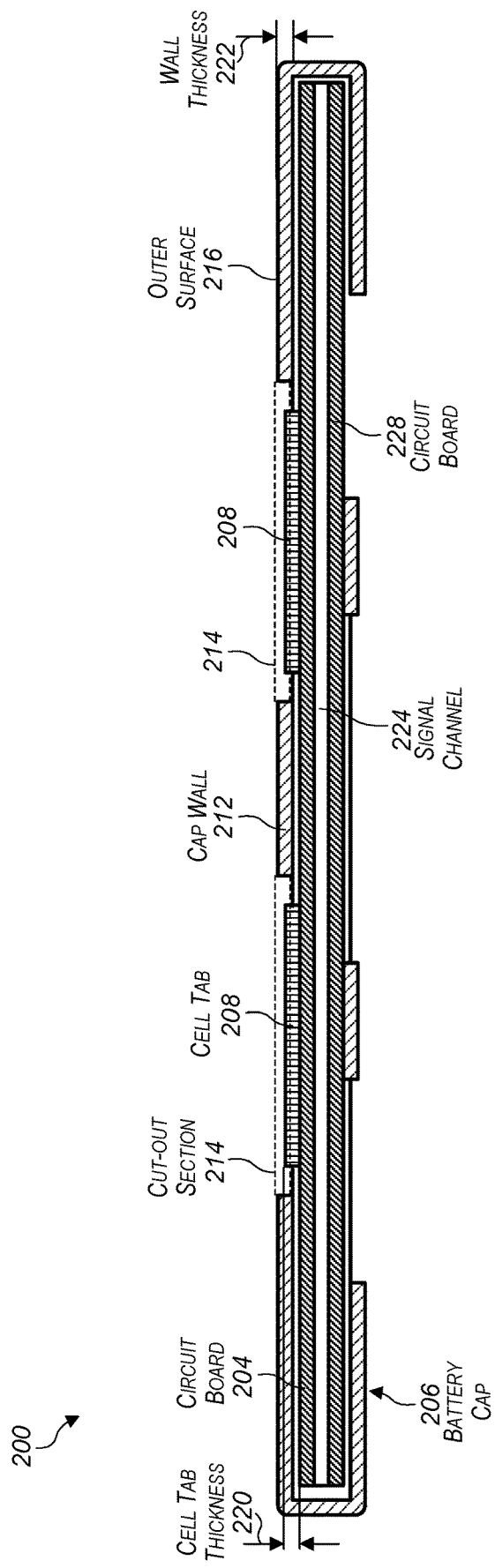
FIG. 2B illustrates a cross-sectional view of the example battery of FIG. 2A, which includes a battery cap with one or more cut-out sections, in accordance with some embodiments.

FIG. 2A illustrates a perspective view of another example battery 200 that includes a battery cap with one or more cut-out sections, in accordance with some embodiments. FIG. 2B illustrates a cross-sectional view of the battery 200 of FIG. 2A. In some embodiments, the battery 200 may include one or multiple features, components, and/or functionality of embodiments described herein with reference to FIGS. 1 and 3A-8.

In various embodiments, the battery 200 may be configured to supply electric power (e.g., to one or more components of a device). The battery 200 may include a battery cell 202, a circuit board 204 (shown in FIG. 2B), and a battery cap 206. The battery cell 202 may include one or more cell tabs 208 (e.g., an anode tab and a cathode tab). The cell tabs 208 may extend outwardly from an end 210 of the battery cell 202.

In some cases, the circuit board 204 may be located proximate the end 210 of the battery cell 202. However, in other embodiments, the circuit board 204 may be located proximate a different region of the battery cell 202. In some embodiments, the circuit board 204 may have a battery monitoring integrated circuit disposed thereon. Furthermore, in some examples, the circuit board 204 may be electrically coupled to the battery cell 202 via the cell tabs 208. In some examples, each of the cell tabs 208 may protrude above the circuit board 204 in a z-axis direction of the coordinate system in FIG. 2A.

In various embodiments, the battery cap 206 may include a cap wall 212 that defines one or more cut-out sections 214. Each of the cut-out sections 214 may be configured to accommodate a respective one of the cell tabs 208. In some examples, each of the cell tabs 208 may protrude above the circuit board 204 in a z-axis direction of the coordinate system in FIG. 2A. In various cases, at least a portion of each of the cell tabs 208 may fit within a respective cut-out section 214. The cap wall 212 may include an outer surface 216 that extends along an x-y plane (orthogonal to the z-axis direction) of the coordinate system in FIG. 2A. Each of the cell tabs 208 may include a respective upper surface 218 that is unencompassed by the outer surface 216 of the cap wall 212.

In some embodiments, each of the cell tabs 208 may have a respective cell tab thickness 220 in the z-axis direction. Furthermore, the cap wall 212 may have a wall thickness 222 in the z-axis direction that is greater than or equal to the cell tab thickness(es) 220.

In some embodiments, the battery 200 may be part of a device (e.g., the devices described below with reference to FIGS. 7 and 8) and/or a system (e.g., the computer system 800 described below with reference to FIG. 8). In some cases, the battery 200, the device, and/or the system may include one or more processors (e.g., not shown) that may be configured to manage electric power provided from the battery to various components (e.g., a display of a device).

Furthermore, in various embodiments, the battery 200, the device, and/or the system may include a signal channel 224 configured to convey signals (and/or electric power from the battery 200) between the circuit board 204 and the processors. A portion of the signal channel 224 may be in electrical contact with the circuit board 204. For instance, a first portion of the signal channel 224 may be substantially planar and may abut a substantially planar side of the circuit board 204 such that the signal channel 224 and the circuit board 204 are in electrical contact. In some examples, the signal channel 224 may include a second portion that extends from the first portion to one or more components that are external to the battery 200 (e.g., a systems interface, a logic board, etc.). The second portion of the signal channel 224 may couple with the other component(s) via one or more interface connectors 226. Furthermore, in some cases, the first portion of the signal channel 224 may be sandwiched between the circuit board 204 and another circuit board 228 of the battery 200. Furthermore, the battery cap 206 may be configured to at least partially encompass a portion of the signal channel 224.

Figure 3A:
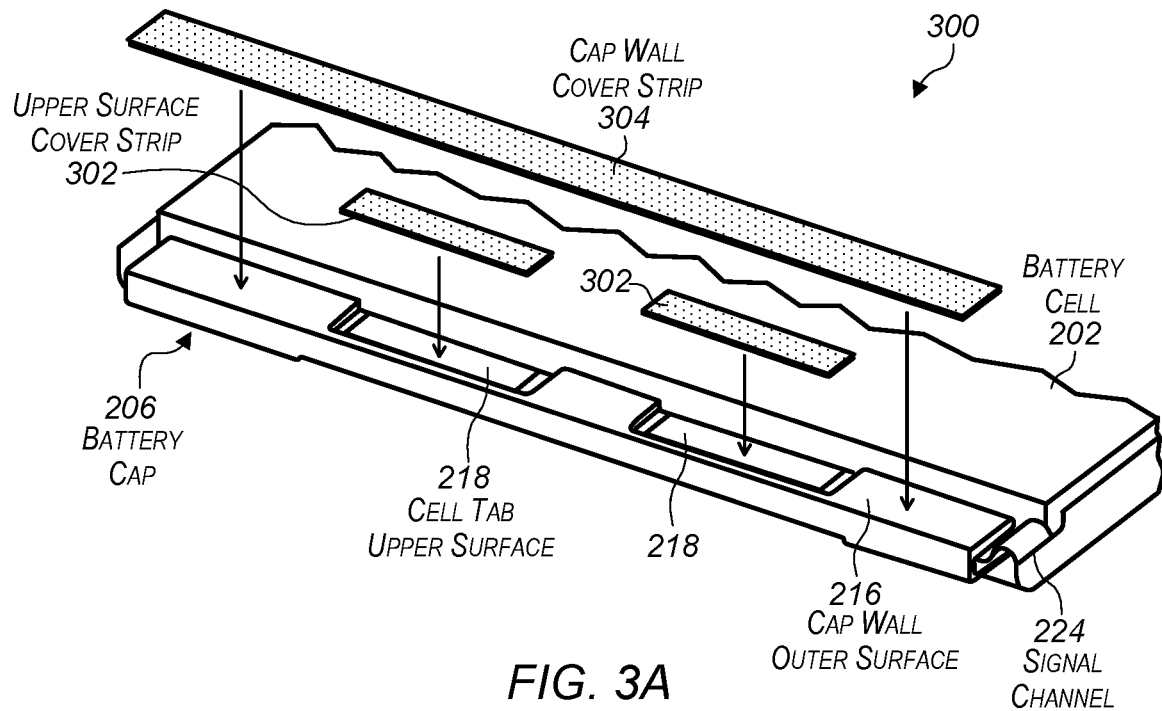
FIGS. 3A-3B each illustrate a perspective view of yet another example battery that includes a battery cap with one or more cut-out sections, in accordance with some embodiments.
Figure 3B:
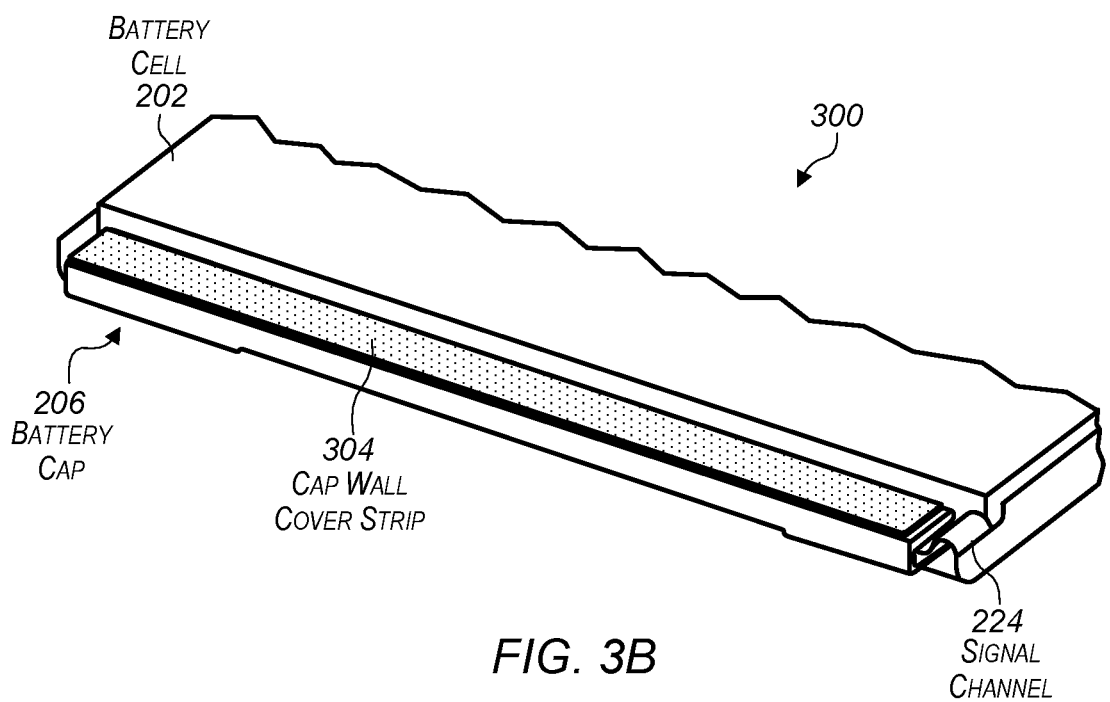

FIGS. 3A-3B each illustrate a perspective view of yet another example battery 300 that includes a battery cap with one or more cut-out sections, in accordance with some embodiments. In FIGS. 3A-3B, the battery 300 may include one or more cover strips. FIG. 3A indicates locations where the cover strips may be affixed by showing an exploded view of the cover strips. FIG. 3B shows the cover strips as affixed to the battery cap 206. In some embodiments, the battery 300 may include one or multiple features, components, and/or functionality of embodiments described herein with reference to FIGS. 1-2B and 4-8.

In various embodiments, the battery 300 may include one or more cover strips 302, 304 configured to cover one or more surfaces of the battery 300. For instance, the battery 300 may include a first set of one or more cover strips that includes, for each respective cell tab upper surface 218, a respective upper surface cover strip 302 configured to cover the respective upper surface 218. Additionally, or alternatively, the cover strips may include a second set of one or more cover strips that includes a cap wall cover strip 304. The cap wall cover strip 304 may be configured to adhere (or otherwise be affixed) to the cap wall outer surface 216 such that the cap wall cover strip 304 covers at least a portion of the outer surface 216, the upper surfaces 218, and/or the upper surface cover strips 302, e.g., as indicated in FIG. 2B.

In some embodiments, the cover strips 302, 304 may be used to protect the upper surfaces 220 of the cell tabs. Additionally, or alternatively, the cover strips 302, 304 may be used to smooth out a difference between a level of the upper surfaces 218 and a level of the outer surface 216 of the cap wall, e.g., to form a flat surface for application of a cosmetic label as discussed below with reference to FIG. 4.

In some examples, one or more of the cover strips 302, 304 may include a thin, flexible material. For instance, one or more of the cover strips 202, 204 may include polyethylene terephthalate (PET) and/or a meta-aramid material. Additionally, or alternatively, one or more of the cover strips 302, 304 may be tape (or include a tape-like material) that can be affixed to surfaces via an adhesive. In some non-limiting examples, one or more of the cover strips 302, 304 may have a thickness dimension range of from about 0.05 mm to about 0.1 mm. However, the cover strips 302, 304 may be any suitable material and may have other thickness dimension ranges in other embodiments.

Figure 4:
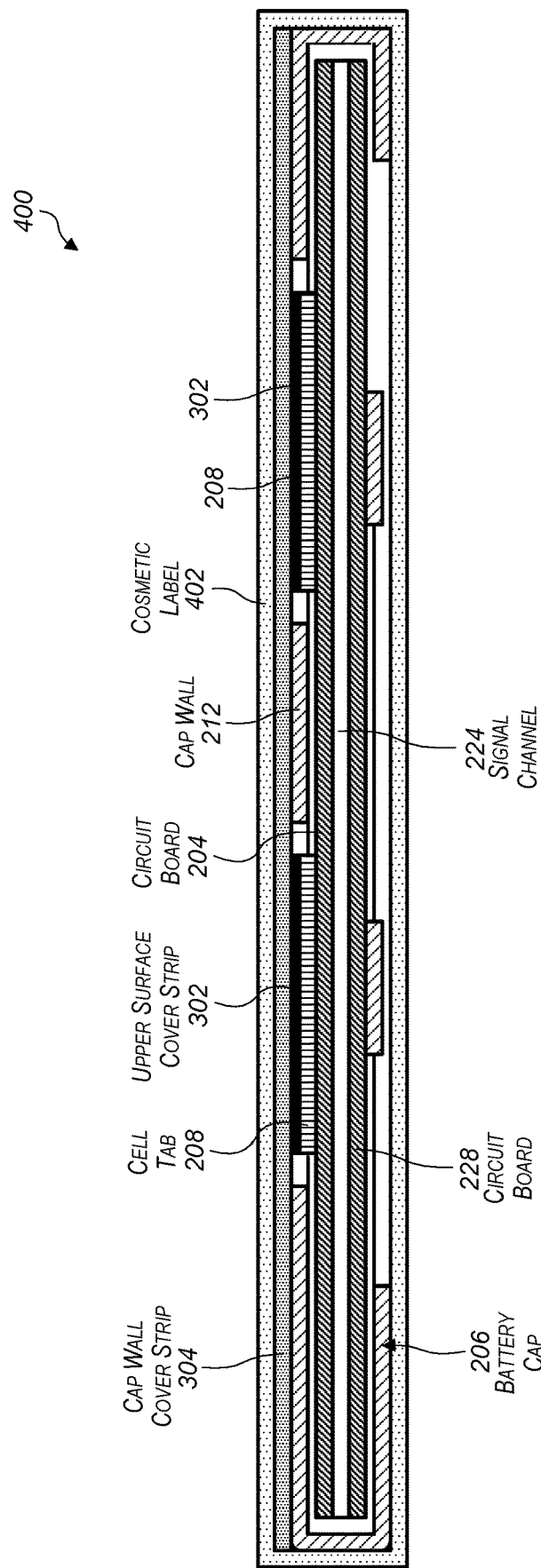
FIG. 4 illustrates a cross-sectional view of still yet another example battery that includes a battery cap with one or more cut-out sections, in accordance with some embodiments.

FIG. 4 illustrates a cross-sectional view of still yet another example battery 400 that includes a battery cap with one or more cut-out sections, in accordance with some embodiments. In FIG. 4, the battery 400 may include one or more cover strips and/or a cosmetic label. In some embodiments, the battery 400 may include one or multiple features, components, and/or functionality of embodiments described herein with reference to FIGS. 1-3B and 5-8.

In some embodiments, the battery 400 may include a cosmetic label 402 that covers the upper surface cover strips 302 and/or the cap wall cover strip 304 such that the cosmetic label 402 provides a cosmetic finish. For instance, the cosmetic label 402 may form a substantially planar layer adjacent to the upper surface cover strips 302 and/or the cap wall cover strip 304. As depicted in FIG. 4, in some embodiments, a portion of the cosmetic label 402 that covers the cap wall cover strip 304 may be flat and/or smooth based at least in part on the corresponding flatness and/or smoothness of the cap wall cover strip 304. In some examples, the cosmetic label 402 may be wrapped around (or otherwise cover) other portions of the battery cap 206. Although not shown in FIG. 4, in some embodiments the cosmetic label 402 may also be wrapped around (or otherwise cover) at least a portion of a battery cell (e.g., the battery cell 202 described above with reference to FIG. 2A) of the battery 400.

Figure 5:
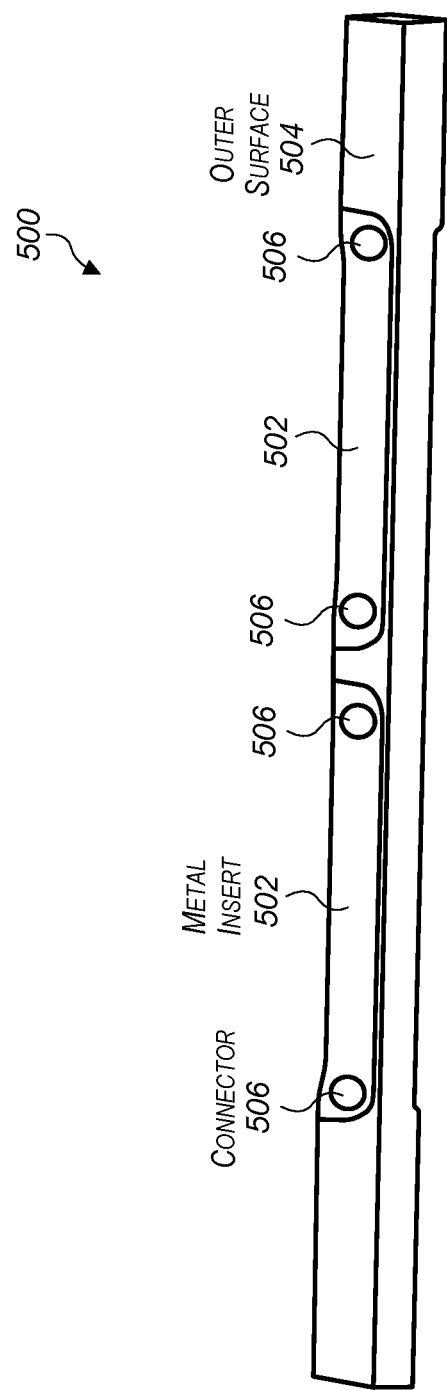
FIG. 5 illustrates a perspective view of an example battery cap that includes one or more cut-out sections and metal inserts, in accordance with some embodiments.

FIG. 5 illustrates a perspective view of an example battery cap 500 that includes one or more cut-out sections and one or more metal inserts, in accordance with some embodiments. In FIG. 5, the battery cap 500 may include one or multiple features, components, and/or functionality of embodiments described herein with reference to FIGS. 1-4 and 6-8.

In some embodiments, the battery cap 500 may include a cap wall that defines one or more cut-out sections, e.g., the cut-out sections 120, 122 described above with reference to FIG. 1. Furthermore, the battery cap 500 may include, one or more metal inserts 502 configured to cover a respective cut-out section. For instance, the metal inserts 502 may be used to cover and/or protect upper surfaces of the cell tabs described above. In some instances, the metal inserts 502 may be used to smooth out a difference between a level of the upper surfaces of the cell tabs and a level of an outer surface 504 of the cap wall, e.g., to form a flat surface for application of a cosmetic label as discussed above with reference to FIG. 4.

In some instances, the battery cap 500 may be formed of a nonconductive material (e.g., a plastic) via a molding process (e.g., injection molding). The battery cap 500 may be formed such that the battery cap 500 includes the cut-out sections that accommodate the cell tabs. In some cases (e.g., where cover strips are not used), the battery cap 500 may be formed such that it embeds the metal inserts 502 in the molding process. In some examples, the metal inserts 502 may be connected to the rest of the battery cap 500 and held in place using one or more connectors 506, which may also be formed during the molding process. As depicted in FIG. 5, two connectors 506 are included for retaining each respective metal insert 502. However, any suitable number and/or types of connectors 502 may be used in other embodiments.

Figure 6:
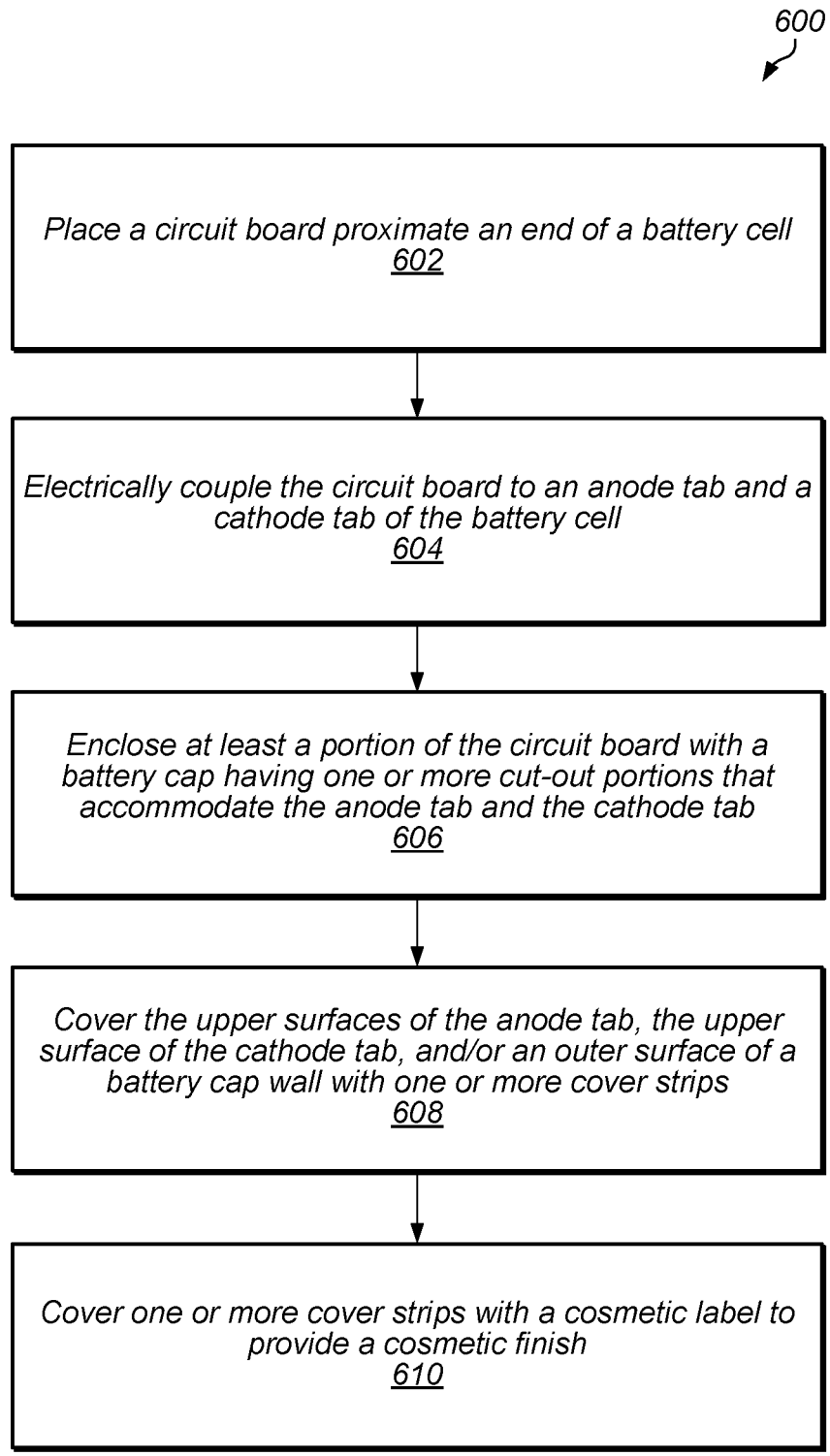
FIG. 6 is a flowchart of an example method of constructing a battery, in accordance with some embodiments.

FIG. 6 is a flowchart of an example method 600 of constructing a battery, in accordance with some embodiments. In some embodiments, the method 600 may include one or multiple features, components, and/or operations of embodiments described herein with reference to FIGS. 1-5, 7, and 8.

At 602, the method 600 may include placing a circuit board proximate an end of a battery cell. For instance, the circuit board may have a battery monitoring integrated circuit disposed thereon.

At 604, the method 600 may include electrically coupling the circuit board to an anode tab and a cathode tab of the battery cell. The anode tab and the cathode tab may extend outwardly from the end of the battery cell that is proximate the circuit board.

At 606, the method 600 may include enclosing at least a portion of the circuit board with a battery cap. The battery cap may have a wall that defines one or more cut-out sections. The cut-out sections may collectively accommodate the anode tab and the cathode tab. Enclosing the portion of the circuit board with the battery cap may include positioning the anode tab and the cathode tab within the cut-out sections of the battery cap. Each of the anode tab and the cathode tab may extend between the circuit board and an outer surface of the wall in a direction that is orthogonal to the outer surface. Furthermore, a respective upper surface of each of the anode tab and the cathode tab is disposed within a respective cut-out section, between an inner surface of the wall and the outer surface of the wall that is opposite the inner surface.

At 608, the method 600 may include covering the upper surface of the anode tab, the upper surface of the cathode tab, and/or the outer surface of the wall of the battery cap with one or more cover strips. In some examples, one or more cover strips may be adhered (or otherwise affixed) to one or more surfaces of the battery cap, the anode tab, and/or the cathode tab. For instance, a first cover strip may be adhered to and/or cover the upper surface of the anode tab. A second cover strip may be adhered to and/or cover the upper surface of the cathode tab. Additionally, or alternatively, a third cover strip may be adhered to and/or cover the outer surface of the wall of the battery cap.

At 610, the method 600 may include covering one or more cover strips with a cosmetic label. For instance, the cosmetic label may cover at least the aforementioned third cover strip such that the cosmetic label provides a cosmetic finish by forming a layer adjacent to the third cover strip that is substantially planar.

Multifunction Device Examples

Embodiments of electronic devices, user interfaces for such devices, and associated processes for using such devices are described. In some embodiments, the device is a portable communications device, such as a mobile telephone, that also contains other functions, such as PDA and/or music player functions. Other portable electronic devices, such as laptops, cameras, cell phones, or tablet computers, may also be used. It should also be understood that, in some embodiments, the device is not a portable communications device, but is a desktop computer with a camera. In other embodiments, the device is not a portable communications device, but is a camera.

In the discussion that follows, an electronic device that includes a display and a touch-sensitive surface is described. It should be understood, however, that the electronic device may include one or more other physical user-interface devices, such as a physical keyboard, a mouse and/or a joystick.

The device typically supports a variety of applications, such as one or more of the following: a drawing application, a presentation application, a word processing application, a website creation application, a disk authoring application, a spreadsheet application, a gaming application, a telephone application, a video conferencing application, an e-mail application, an instant messaging application, a workout support application, a photo management application, a digital camera application, a digital video camera application, a web browsing application, a digital music player application, and/or a digital video player application.

The various applications that may be executed on the device may use at least one common physical user-interface device, such as the touch-sensitive surface. One or more functions of the touch-sensitive surface as well as corresponding information displayed on the device may be adjusted and/or varied from one application to the next and/or within a respective application. In this way, a common physical architecture (such as the touch-sensitive surface) of the device may support the variety of applications with user interfaces that are intuitive and transparent to the user.

Figure 7:
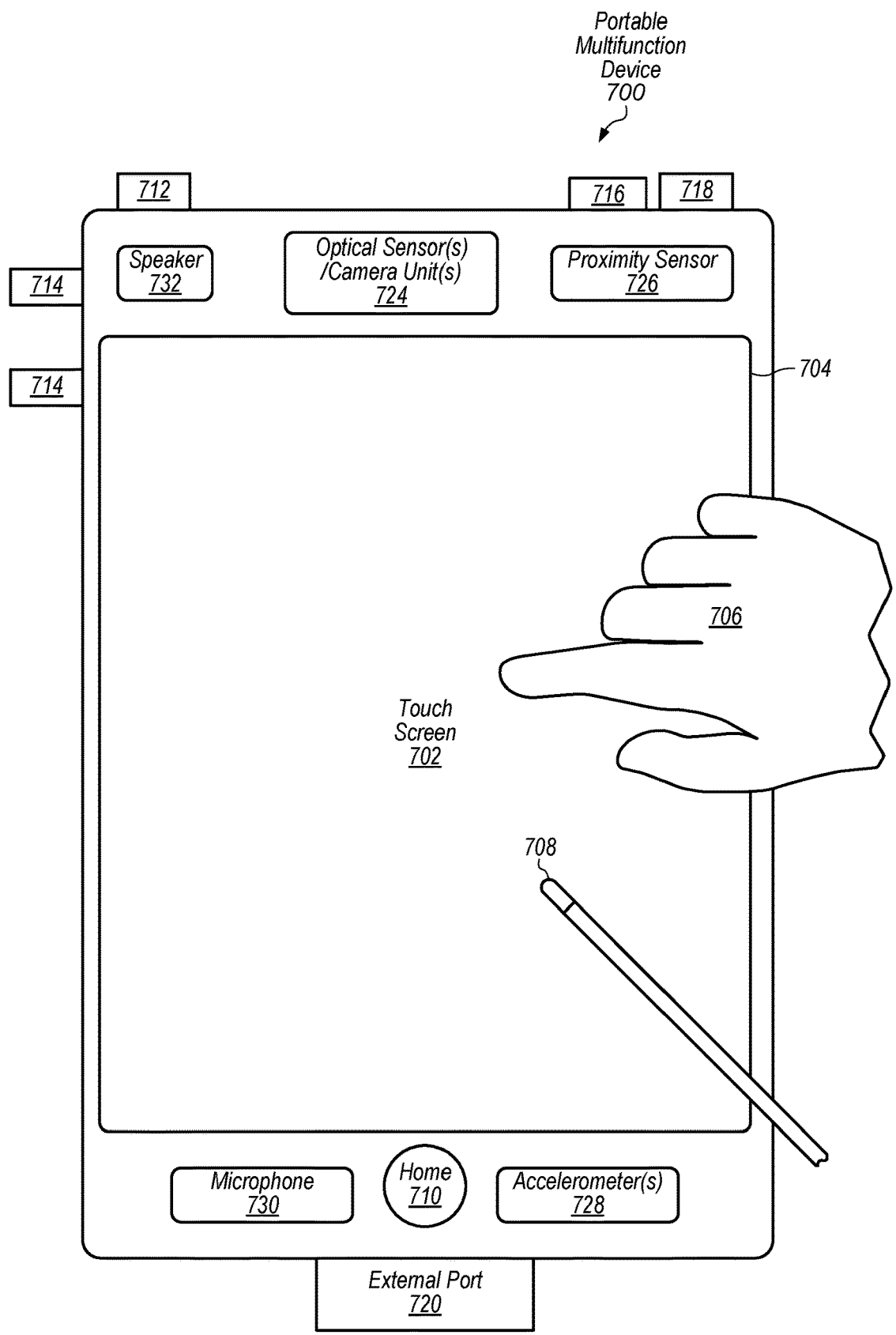
FIG. 7 depicts a portable multifunction device with which a battery having a battery cap with one or more cut-out sections may be used, in accordance with some embodiments.

FIG. 7 illustrates a portable multifunction device 700 that may include embodiments of the batteries disclosed herein, e.g., in the discussion above with reference to FIGS. 1-6. Device 700 may include a display, e.g., a touch screen 702. The touch screen 702 may display one or more graphics within user interface (UI) 704. In this embodiment, as well as others described below, a user may select one or more of the graphics by making a gesture on the graphics, for example, with one or more fingers 706 (not drawn to scale in the figure) or one or more styluses 708 (not drawn to scale in the figure).

Device 700 may also include one or more physical buttons, such as "home" or menu button 710. The menu button 710 may be used to navigate to any application in a set of applications that may be executed on device 700. Alternatively, in some embodiments, the menu button 710 is implemented as a soft key in a GUI displayed on touch screen 702.

In one embodiment, device 700 includes touch screen 702, menu button 710, push button 712 for powering the device on/off and locking the device, volume adjustment button(s) 714, Subscriber Identity Module (SIM) card slot 716, head set jack 718, and docking/charging external port 720. Push button 712 may be used to turn the power on/off on the device 700 by depressing the button and holding the button in the depressed state for a predefined time interval; to lock the device 700 by depressing the button and releasing the button before the predefined time interval has elapsed; and/or to unlock the device 700 or initiate an unlock process. In an alternative embodiment, device 700 also may accept verbal input for activation or deactivation of some functions through microphone 722.

Device 700 may also include optical sensors or cameras 724. Optical sensors 724 may include charge-coupled device (CCD) or complementary metal-oxide semiconductor (CMOS) phototransistors. Optical sensors 724 receive light from the environment, projected through one or more lens, and converts the light to data representing an image. Optical sensors 724 may be used to capture still images or video. In some embodiments, an optical sensor 724 is located on the back of device 700, opposite touch screen display 702 on the front of the device 700, so that the touch screen display 702 may be used as a viewfinder for still and/or video image acquisition. In some embodiments, another optical sensor 724 is located on the front of the device 700 so that the user's image may be obtained for videoconferencing while the user views the other video conference participants on the touch screen display. In embodiments in which multiple cameras or optical sensors 724 are supported, each of the multiple cameras or optical sensors 724 may include its own photosensor(s), or the multiple cameras or optical sensors 724 may be supported by a shared photosensor. Likewise, in embodiments in which multiple cameras or optical sensors 724 are supported, each of the multiple cameras or optical sensors 724 may include its own image processing pipeline of processors and storage units, or the multiple cameras or optical sensors 724 may be supported by an image processing pipeline of processors and storage units.

Device 700 may include one or more proximity sensors 726. In some embodiments, the proximity sensor 726 turns off and disables touch screen 702 when the multifunction device 700 is placed near the user's ear (e.g., when the user is making a phone call).

Device 700 may include one or more orientation sensors 728. In some embodiments, the one or more orientation sensors include one or more accelerometers 728 (e.g., one or more linear accelerometers and/or one or more rotational accelerometers). In some embodiments, the one or more orientation sensors 728 include one or more gyroscopes. In some embodiments, the one or more orientation sensors 728 include one or more magnetometers. In some embodiments, the one or more orientation sensors 728 include one or more of global positioning system (GPS), Global Navigation Satellite System (GLONASS), and/or other global navigation system receivers. The GPS, GLONASS, and/or other global navigation system receivers may be used for obtaining information concerning the location and orientation (e.g., portrait or landscape) of device 700. In some embodiments, the one or more orientation sensors 728 include any combination of orientation/rotation sensors. In some embodiments, information is displayed on the touch screen display 702 in a portrait view or a landscape view based on an analysis of data received from the one or more orientation sensors 728.

Device 700 may include one or more microphones 730 and/or one or more speakers 732, which, along with audio circuitry, provide an audio interface between a user and device 700. The audio circuitry receives audio data from a peripherals interface, converts the audio data to an electrical signal, and transmits the electrical signal to the speaker 732. Speaker 32 converts the electrical signal to human-audible sound waves. Audio circuitry also receives electrical signals converted by microphone 730 from sound waves. Audio circuitry converts the electrical signal to audio data and transmits the audio data to the peripherals interface for processing. Audio data may be retrieved from and/or transmitted to memory and/or RF circuitry by the peripherals interface. In some embodiments, the audio circuitry also includes the headset jack 718. The headset jack 718 provides an interface between the audio circuitry and removable audio input/output peripherals, such as output-only headphones or a headset with both output (e.g., a headphone for one or both ears) and input (e.g., a microphone).

Example Computer System

Figure 8:
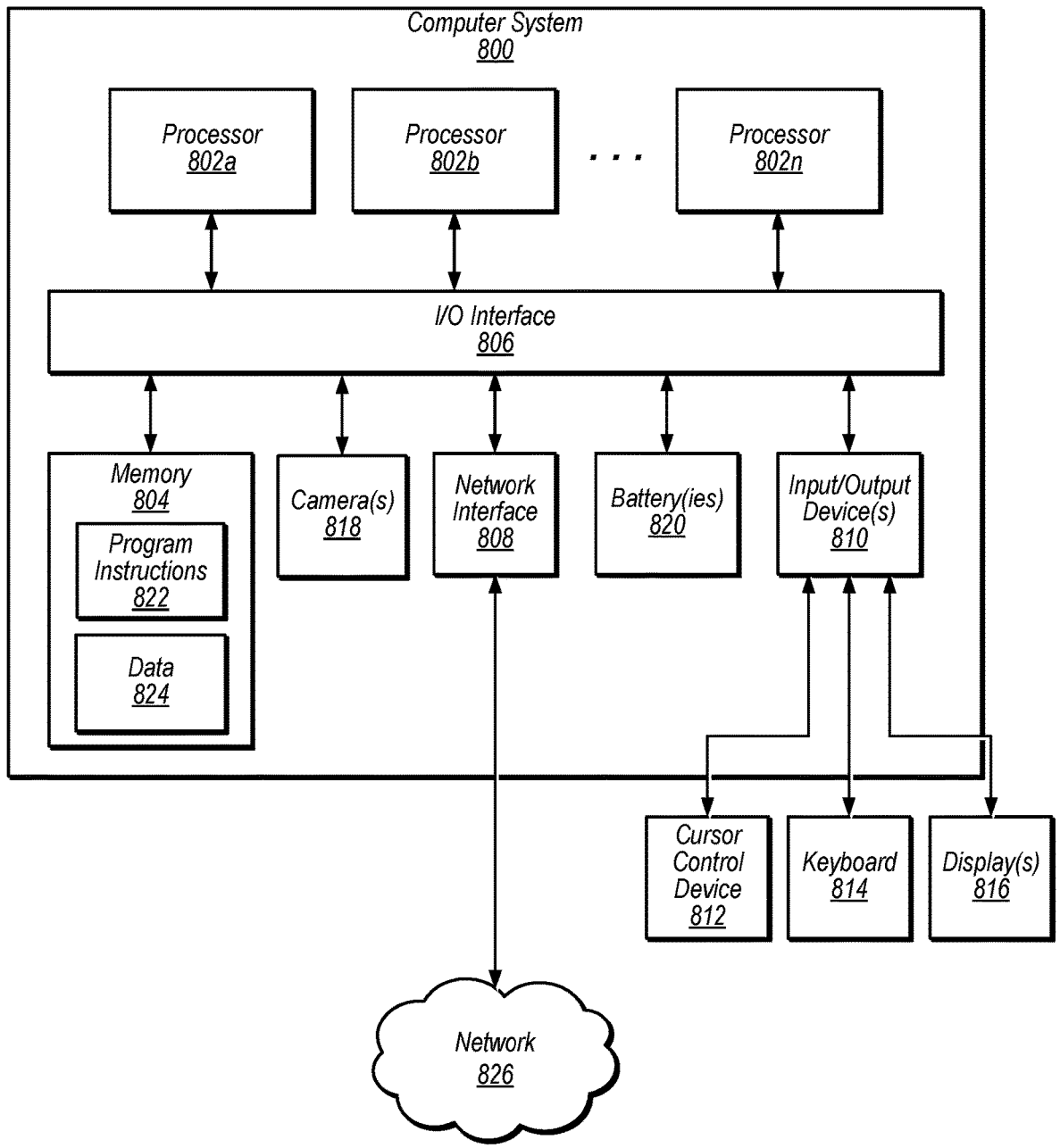
FIG. 8 illustrates an example computer system with which a battery having a battery cap with one or more cut-out sections may be used, in accordance with some embodiments.

FIG. 8 illustrates an example computing device, referred to as computer system 800, that may include embodiments of the batteries disclosed herein, e.g., in the discussion above with reference to FIGS. 1-7. In addition, computer system 800 may implement methods for controlling operations of the batteries disclosed herein. In different embodiments, computer system 800 may be any of various types of devices, including, but not limited to, a personal computer system, desktop computer, laptop, notebook, tablet or pad device, slate, or netbook computer, mainframe computer system, handheld computer, workstation, network computer, a camera, a set top box, a mobile device, a wireless phone, a smartphone, a consumer device, video game console, handheld video game device, application server, storage device, a television, a video recording device, a peripheral device such as a switch, modem, router, or in general any type of computing or electronic device.

In the illustrated embodiment, computer system 800 includes one or more processors 802 coupled to a system memory 804 via an input/output (I/O) interface 806. Computer system 800 further includes a network interface 808 coupled to I/O interface 806, and one or more input/output devices 810, such as cursor control device 812, keyboard 814, and display(s) 816. Computer system 800 may also include one or more cameras 818 and/or one or more batteries 820 (e.g., one or more embodiments of the batteries described herein), which may also be coupled to I/O interface 806.

In various embodiments, computer system 800 may be a uniprocessor system including one processor 802, or a multiprocessor system including several processors 802 (e.g., two, four, eight, or another suitable number). Processors 802 may be any suitable processor capable of executing instructions. For example, in various embodiments processors 802 may be general-purpose or embedded processors implementing any of a variety of instruction set architectures (ISAs), such as the x86, PowerPC, SPARC, or MIPS ISAs, or any other suitable ISA. In multiprocessor systems, each of processors 802 may commonly, but not necessarily, implement the same ISA.

System memory 804 may be configured to store program instructions 822 and/or data 824 accessible by processor 802. In various embodiments, system memory 804 may be implemented using any suitable memory technology, such as static random access memory (SRAM), synchronous dynamic RAM (SDRAM), nonvolatile/Flash-type memory, or any other type of memory. In the illustrated embodiment, program instructions 822 may be configured to implement various interfaces, methods and/or data for controlling operations of the battery 820. Furthermore, program instructions 822 may be configured to implement various interfaces, methods and/or data for controlling operations of the camera 818 and for capturing and processing images with integrated camera 818 or other methods or data, for example interfaces and methods for capturing, displaying, processing, and storing images captured with camera 818. In some embodiments, program instructions 822 and/or data 824 may be received, sent or stored upon different types of computer-accessible media or on similar media separate from system memory 804 or computer system 800.

In one embodiment, I/O interface 806 may be configured to coordinate I/O traffic between processor 802, system memory 804, and any peripheral devices in the device, including network interface 808 or other peripheral interfaces, such as input/output devices 810. In some embodiments, I/O interface 806 may perform any necessary protocol, timing or other data transformations to convert data signals from one component (e.g., system memory 804) into a format suitable for use by another component (e.g., processor 802). In some embodiments, I/O interface 806 may include support for devices attached through various types of peripheral buses, such as a variant of the Peripheral Component Interconnect (PCI) bus standard or the Universal Serial Bus (USB) standard, for example. In some embodiments, the function of I/O interface 806 may be split into two or more separate components, such as a north bridge and a south bridge, for example. Also, in some embodiments some or all of the functionality of I/O interface 806, such as an interface to system memory 804, may be incorporated directly into processor 802.

Network interface 808 may be configured to allow data to be exchanged between computer system 800 and other devices attached to a network 826 (e.g., carrier or agent devices) or between nodes of computer system 800. Network 826 may in various embodiments include one or more networks including but not limited to Local Area Networks (LANs) (e.g., an Ethernet or corporate network), Wide Area Networks (WANs) (e.g., the Internet), wireless data networks, some other electronic data network, or some combination thereof. In various embodiments, network interface 808 may support communication via wired or wireless general data networks, such as any suitable type of Ethernet network, for example; via telecommunications/telephony networks such as analog voice networks or digital fiber communications networks; via storage area networks such as Fibre Channel SANs, or via any other suitable type of network and/or protocol.

Input/output devices 810 may, in some embodiments, include one or more display terminals, keyboards, keypads, touchpads, scanning devices, voice or optical recognition devices, or any other devices suitable for entering or accessing data by computer system 800. Multiple input/output devices 810 may be present in computer system 800 or may be distributed on various nodes of computer system 800. In some embodiments, similar input/output devices may be separate from computer system 800 and may interact with one or more nodes of computer system 800 through a wired or wireless connection, such as over network interface 808.

As shown in FIG. 8, memory 804 may include program instructions 822, which may be processor-executable to implement any element or action to support the battery 820.

For instance, data from signals produced by the battery 820 may be stored to memory 804 in some cases. Furthermore, the program instructions 822 may be processor-executable to implement any element or action to support the integrated camera 818, including but not limited to image processing software and interface software for controlling camera 818. In some embodiments, images captured by camera 818 may be stored to memory 804. In addition, metadata for images captured by camera 818 may be stored to memory 804.

Those skilled in the art will appreciate that computer system 800 is merely illustrative and is not intended to limit the scope of embodiments. In particular, the computer system and devices may include any combination of hardware or software that can perform the indicated functions, including computers, network devices, Internet appliances, PDAs, wireless phones, pagers, video or still cameras, etc. Computer system 800 may also be connected to other devices that are not illustrated, or instead may operate as a stand-alone system. In addition, the functionality provided by the illustrated components may in some embodiments be combined in fewer components or distributed in additional components. Similarly, in some embodiments, the functionality of some of the illustrated components may not be provided and/or other additional functionality may be available.

Those skilled in the art will also appreciate that, while various items are illustrated as being stored in memory or on storage while being used, these items or portions of them may be transferred between memory and other storage devices for purposes of memory management and data integrity. Alternatively, in other embodiments some or all of the software components may execute in memory on another device and communicate with the illustrated computer system 800 via inter-computer communication. Some or all of the system components or data structures may also be stored (e.g., as instructions or structured data) on a computer-accessible medium or a portable article to be read by an appropriate drive, various examples of which are described above. In some embodiments, instructions stored on a computer-accessible medium separate from computer system 800 may be transmitted to computer system 800 via transmission media or signals such as electrical, electromagnetic, or digital signals, conveyed via a communication medium such as a network and/or a wireless link. Various embodiments may further include receiving, sending or storing instructions and/or data implemented in accordance with the foregoing description upon a computer-accessible medium. Generally speaking, a computer-accessible medium may include a non-transitory, computer-readable storage medium or memory medium such as magnetic or optical media, e.g., disk or DVD/CD-ROM, volatile or non-volatile media such as RAM (e.g. SDRAM, DDR, RDRAM, SRAM, etc.), ROM, etc. In some embodiments, a computer-accessible medium may include transmission media or signals such as electrical, electromagnetic, or digital signals, conveyed via a communication medium such as network and/or a wireless link.

The methods described herein may be implemented in software, hardware, or a combination thereof, in different embodiments. In addition, the order of the blocks of the methods may be changed, and various elements may be added, reordered, combined, omitted, modified, etc. Various modifications and changes may be made as would be obvious to a person skilled in the art having the benefit of this disclosure. The various embodiments described herein are meant to be illustrative and not limiting. Many variations, modifications, additions, and improvements are possible. Accordingly, plural instances may be provided for components described herein as a single instance. Boundaries between various components, operations and data stores are somewhat arbitrary, and particular operations are illustrated in the context of specific illustrative configurations. Other allocations of functionality are envisioned and may fall within the scope of claims that follow. Finally, structures and functionality presented as discrete components in the example configurations may be implemented as a combined structure or component. These and other variations, modifications, additions, and improvements may fall within the scope of embodiments as defined in the claims that follow.

What is claimed is:

1. A battery, comprising:
a battery cell having an anode tab and a cathode tab;
a circuit board having a battery monitoring integrated circuit disposed thereon,
wherein the circuit board is electrically coupled to the anode tab and the cathode tab;
a battery cap over at least a portion of the circuit board, wherein the battery cap has a wall that comprises a flat inner surface and an opposing flat outer surface, and
wherein the wall defines one or more openings that collectively accommodate the anode tab and the cathode tab such that:
each of the anode tab and the cathode tab extends between the circuit board and the flat outer surface of the wall in a first direction that is orthogonal to the flat outer surface; and
a respective upper surface of each of the anode tab and the cathode tab is disposed within a respective opening of the one or more openings; and
one or more protective covers, comprising a protective cover that has a surface that is coplanar with or attached to the flat outer surface of the wall, wherein the protective cover does not cover a surface of the battery cap outside the flat outer surface of the wall.

2. The battery of claim 1, wherein the one or more protective covers are disposed within the respective one or more openings, between the flat outer surface of the wall and the respective upper surface of the anode tab or the cathode tab.

3. The battery of claim 1, wherein the one or more protective covers comprise:
a first cover strip that covers the upper surface of the anode tab; and
a second cover strip that covers the upper surface of the cathode tab.

4. The battery of claim 3, wherein each of the first cover strip and the second cover strip is 0.1 mm or thinner.

5. The battery of claim 3, wherein:
the first cover strip extends, in the direction that is orthogonal to the flat outer surface of the wall, from the upper surface of the anode tab to a plane defined by the flat outer surface, such that an upper surface of the first cover strip is coplanar with the flat outer surface; and
the second cover strip extends, in the direction that is orthogonal to the flat outer surface, from the upper surface of the cathode tab to the plane defined by the flat outer surface, such that an upper surface of the second cover strip is coplanar with the flat outer surface.

6. The battery of claim 3, further comprising:
a third cover strip having a flat surface attached to at least one of:
the upper surface of the first cover strip;
the upper surface of the second cover strip; or
the flat outer surface of the wall.

7. The battery of claim 1, wherein:
the one or more protective covers comprise:
a first metal insert that covers the upper surface of the anode tab; and
a second metal insert that covers the upper surface of the cathode tab; and
the battery cap is formed of a nonconductive material and comprises one or more connectors for retaining the first metal insert and the second metal insert.

8. An electronic device, comprising:
a battery, comprising:
a battery cell having an anode tab and a cathode tab;
a circuit board having a battery monitoring integrated circuit disposed thereon, wherein the circuit board is electrically coupled to the anode tab and the cathode tab; and
a battery cap over at least a portion of the circuit board, wherein the battery cap has a top wall that comprises a flat bottom surface and an opposing flat top surface, and
wherein the top wall defines one or more cut-out sections that collectively accommodate the anode tab and the cathode tab such that:
each of the anode tab and the cathode tab extends between the circuit board and the flat top surface of the top wall in a direction that is orthogonal to the flat top surface; and
a respective upper surface of each of the anode tab and the cathode tab is disposed within a respective cut-out section of the one or more cut-out sections;
one or more protective covers, comprising a protective cover that has a surface that is coplanar with or attached to the flat top surface of the top wall, wherein the protective cover does not cover a surface of the battery cap outside the flat top surface of the top wall; and
one or more processors configured to:
receive signals from the circuit board; and
manage electric power provided from the battery to a display based at least in part on the signals received from the circuit board.

9. The electronic device of claim 8, wherein the protective cover is a cap wall cover strip attached to the flat top surface of the top wall.

10. The electronic device of claim 9, wherein the cap wall cover strip covers the one or more cut-out sections.

11. The electronic device of claim 9, wherein the one or more protective covers further comprise:
a first cover strip attached to the upper surface of the anode tab; and
a second cover strip attached to the upper surface of the cathode tab;
wherein the cap wall cover strip covers the first cover strip and the second cover strip.

12. The electronic device of claim 11, wherein:
the first cover strip extends, in the direction that is orthogonal to the surface of the display, from the upper surface of the anode tab to a plane defined by the flat top surface of the wall, such that an upper surface of the first cover strip is coplanar with the flat top surface; and
the second cover strip extends, in the direction that is orthogonal to the surface of the display, from the upper surface of the cathode tab to the plane defined by the flat top surface, such that an upper surface of the second cover strip is coplanar with the flat top surface.

13. The electronic device of claim 11, wherein the first cover strip and the second cover strip comprise at least one of:
a polyethylene terephthalate (PET) material; or
a meta-aramid material.

14. The electronic device of claim 11, wherein the first cover strip comprises tape attached to the upper surface of the anode tab via an adhesive.

15. The electronic device of claim 14, wherein the first cover strip comprises a thickness dimension ranging from 0.05 mm to 0.1 mm.

16. The electronic device of claim 8, wherein:
the one or more protective covers comprise:
   a first metal insert that covers the upper surface of the anode tab; and
   a second metal insert that covers the upper surface of the cathode tab; and
the battery cap is formed of a nonconductive material and comprises one or more connectors for retaining the first metal insert and the second metal insert.

17. The electronic device of claim 8, further comprising:
the display, wherein the display is configured to present visual content; and
a signal channel configured to convey at least one of signals or electrical power between the circuit board and one or more components of the electronic device that are external to the battery, wherein:
   at least a portion of the signal channel is in electrical contact with the circuit board; and
   the battery cap at least partially covers the at least a portion of the signal channel.

18. A method of constructing a battery, the method comprising:
electrically coupling a circuit board to an anode tab and a cathode tab of a battery cell, wherein the circuit board has a battery monitoring integrated circuit disposed thereon; and
placing a battery cap over at least a portion of the circuit board, wherein:
   the battery cap has a wall that defines one or more cut-out sections that collectively accommodate the anode tab and the cathode tab of the battery cell; and
   the enclosing includes positioning the anode tab and the cathode tab within the one or more cut-out sections such that:
      each of the anode tab and the cathode tab extends between the circuit board and a flat outer surface of the wall in a direction that is orthogonal to the flat outer surface; and
      a respective upper surface of each of the anode tab and the cathode tab is disposed within a respective cut-out section of the one or more cut-out sections; and
covering, using one or more protective covers, at least a portion of the battery cap, wherein the one or more protective covers comprise a protective cover that has a surface that is coplanar with or attached to the flat outer surface of the wall, wherein the protective cover does not cover a surface of the battery cap outside the flat outer surface of the wall.

19. The method of claim 18, wherein:
the protective cover is a cap wall cover strip; and
the covering comprises:
   attaching a first cover strip to the upper surface of the anode tab;
   attaching a second cover strip to the upper surface of the cathode tab; and
   attaching the cap wall cover strip to the flat outer surface of the wall, such that the cap wall cover strip covers at least one of the first cover strip or the second cover strip.

20. The method of claim 18, wherein:
the one or more protective covers comprise:
   a first metal insert that covers the upper surface of the anode tab; and
   a second metal insert that covers the upper surface of the cathode tab; and
the method further comprises:
   forming, using a molding process, the battery cap and the one or more protective covers, wherein the forming comprises:
      embedding the first metal insert and the second metal insert in a nonconductive material used to form the battery cap in the molding process.

\* \* \* \* \*